(12) United States Patent
Sung

(10) Patent No.: US 10,492,316 B2
(45) Date of Patent: Nov. 26, 2019

(54) COMPUTER SYSTEM

(71) Applicant: Fujitsu Client Computing Limited, Kawasaki-shi (JP)

(72) Inventor: Morris Sung, München (DE)

(73) Assignee: Fujitsu Client Computing Limited, Kawasaki (JP)

( * ) Notice: Subject to any disclaimer, the term of this patent is extended or adjusted under 35 U.S.C. 154(b) by 0 days.

(21) Appl. No.: 16/180,309

(22) Filed: Nov. 5, 2018

(65) Prior Publication Data

US 2019/0141848 A1 May 9, 2019

(30) Foreign Application Priority Data

Nov. 7, 2017 (DE) .................. 10 2017 125 995
Dec. 13, 2017 (DE) .................. 10 2017 129 827

(51) Int. Cl.
*H05K 5/02* (2006.01)
*G06F 1/18* (2006.01)
*G06F 1/16* (2006.01)

(52) U.S. Cl.
CPC ......... *H05K 5/0217* (2013.01); *G06F 1/1601* (2013.01); *G06F 1/1607* (2013.01); *G06F 1/181* (2013.01); *H05K 5/0234* (2013.01)

(58) Field of Classification Search
CPC combination set(s) only.
See application file for complete search history.

(56) References Cited

U.S. PATENT DOCUMENTS 6,081,420 A * 6/2000 Kim .................... G06F 1/16
361/679.22
6,208,505 B1 * 3/2001 Kuchta ................ G06F 1/1601
248/918

(Continued)

FOREIGN PATENT DOCUMENTS

DE 20315413 U1 2/2004
DE 202008014953 U1 2/2009

(Continued)

OTHER PUBLICATIONS

Globalpr—Two new Lian Li mini-Q series mini-ITX chassis—PC-Q09 & PC-Q09F, Sep. 9, 2010. https://www.globalpr.agency/press-room/lian-li/press-releases/article/two-new-lian-li-mini-q-series-mini-itx-chassis-pc-q09-pc-q09f/.

(Continued)

*Primary Examiner* — Lisa Lea-Edmonds
(74) *Attorney, Agent, or Firm* — DLA Piper LLP (US)

(57) ABSTRACT

A computer system includes an electronic display; a display stand that supports the electronic display, the display stand having a bottom plate for placement of the stand on a selected location and having a vertical section extending from the bottom plate; an electronic computer device including a housing, wherein a mounting wall is fixed to the housing; and a mounting bracket fixedly connected to the mounting wall of the electronic computer device such that an overlapping part of the mounting bracket overlaps the housing of the electronic computer device at one side, wherein the mounting bracket is fixedly connected to a back side of the vertical section of the display stand such that the overlapping part of the mounting bracket contacts the bottom plate for support of the electronic computer device.

9 Claims, 8 Drawing Sheets

(56) References Cited

U.S. PATENT DOCUMENTS

| | | | | |
|---|---|---|---|---|
| 6,282,082 B1* | 8/2001 | Armitage | G06F 1/16 | 312/223.2 |
| 6,366,452 B1* | 4/2002 | Wang | F16M 11/10 | 248/125.1 |
| 6,366,453 B1* | 4/2002 | Wang | G06F 1/16 | 248/917 |
| 6,680,843 B2* | 1/2004 | Farrow | G06F 1/1601 | 361/679.02 |
| 6,833,988 B2* | 12/2004 | Kamphuis | G06F 1/1601 | 248/424 |
| 6,917,519 B2* | 7/2005 | Coyle | G06F 1/181 | 361/679.6 |
| 7,362,310 B2* | 4/2008 | Wilk | G06F 1/16 | 345/156 |
| 7,471,511 B2* | 12/2008 | Montag | G06F 1/1601 | 348/730 |
| 7,477,510 B2* | 1/2009 | Liu | G06F 1/16 | 361/679.08 |
| 7,542,052 B2* | 6/2009 | Solomon | G06F 1/1601 | 345/156 |
| 7,593,219 B2* | 9/2009 | Quijano | F16M 11/10 | 248/923 |
| 7,804,679 B2* | 9/2010 | Pischl | G06F 1/1601 | 248/917 |
| 7,848,090 B2* | 12/2010 | Ikeda | G06F 1/1601 | 361/679.21 |
| 7,995,331 B2* | 8/2011 | Seitz | B23Q 1/0045 | 248/278.1 |
| 8,279,593 B2* | 10/2012 | Zheng | G06F 1/1601 | 211/26 |
| 8,317,146 B2* | 11/2012 | Jung | G06F 1/1601 | 248/125.7 |
| 8,576,554 B2* | 11/2013 | Quijano | G06F 1/1607 | 361/679.23 |
| 8,608,119 B2* | 12/2013 | Wolff | F16M 11/10 | 248/123.2 |
| 8,717,755 B2* | 5/2014 | Haren | G06F 1/1607 | 361/679.41 |
| D714,794 S | 10/2014 | Quijano et al. | | |
| 8,934,061 B1* | 1/2015 | Wengreen | H04N 5/64 | 348/836 |
| 9,141,137 B2* | 9/2015 | Chen | G06F 1/1601 | |
| 9,207,722 B2* | 12/2015 | Ergun | G06F 1/1607 | |
| 9,218,019 B2* | 12/2015 | Quijano | G06F 1/1601 | |
| 9,441,782 B2* | 9/2016 | Funk | F16M 13/02 | |
| 9,602,760 B2* | 3/2017 | Griffin | H04N 5/64 | |
| 10,114,408 B2* | 10/2018 | Ent | G06F 1/16 | |
| 2003/0227746 A1* | 12/2003 | Sato | G06F 1/1626 | 361/679.57 |
| 2004/0085715 A1* | 5/2004 | Bidwell | A61B 8/00 | 361/679.4 |
| 2007/0070591 A1* | 3/2007 | Sheng | G06F 1/18 | 361/679.22 |
| 2010/0188812 A1* | 7/2010 | Morrison | F16M 11/041 | 361/679.58 |
| 2011/0216495 A1* | 9/2011 | Marx | H05K 5/02 | 361/679.22 |
| 2012/0120581 A1* | 5/2012 | Haren | G06F 1/1607 | 361/679.21 |
| 2013/0058030 A1* | 3/2013 | Mabon | G11B 33/124 | 361/679.32 |
| 2013/0228662 A1* | 9/2013 | Green | G06F 1/1607 | 248/229.1 |
| 2013/0264919 A1* | 10/2013 | Sullivan | H05K 5/0204 | 312/223.2 |
| 2014/0062911 A1* | 3/2014 | Wu | G06F 1/1601 | 345/173 |
| 2014/0321039 A1 | 10/2014 | Quijano et al. | | |
| 2015/0355676 A1* | 12/2015 | Anuez | G06F 1/187 | 349/12 |
| 2016/0161996 A1* | 6/2016 | Fan | G06F 1/187 | 361/679.33 |

FOREIGN PATENT DOCUMENTS

| | | | | |
|---|---|---|---|---|
| DE | 102017129827 B3 * | 3/2019 | | G06F 1/16 |
| GB | 2420697 A * | 6/2006 | | F16M 11/10 |
| GB | 2545977 A | 7/2017 | | |
| JP | 2008-176599 A | 7/2008 | | |

OTHER PUBLICATIONS

Search Report dated Apr. 1, 2019, of counterpart Great Britain Application No. GB1818072.9.

* cited by examiner

COMPUTER SYSTEM

TECHNICAL FIELD

This disclosure relates to computer systems comprising an electronic display and a display stand to support the electronic display, as well as an electronic computer device.

BACKGROUND

Computer systems of the above-mentioned type are widely known in the field of information technology systems. In general, an electronic computer device, e.g., a personal computer, a so-called mini personal computer, a thin client or a zero client, is connected to the display via one or more cables to transfer video and/or audio data. In a typical environment, e.g., in an office or working environment, space is required for the electronic computer device to be placed. However, due to cabling, a possible disorder such as cable spaghetti, as well as accidental unplugging of the cables can occur.

There is a need for improved systems that allow a safe and easy installation for an electronic computer device to avoid or reduce the problems mentioned above.

SUMMARY

I provide a computer system including an electronic display, a display stand that supports the electronic display, the display stand having a bottom plate for placement of the stand on a selected location and having a vertical section extending from the bottom plate, an electronic computer device including a housing, wherein a mounting wall is fixed to the housing, and a mounting bracket fixedly connected to the mounting wall of the electronic computer device such that an overlapping part of the mounting bracket overlaps the housing of the electronic computer device at one side, wherein the mounting bracket is fixedly connected to a back side of the vertical section of the display stand such that the overlapping part of the mounting bracket contacts the bottom plate for support of the electronic computer device.

I also provide a computer system including an electronic display with a back side, wherein fixation pins are fixedly arranged on the back side, a display stand to support the electronic display, and an electronic computer device including a housing, wherein a mounting wall is fixed to the housing, the mounting wall having hang-in elements corresponding to the fixation pins, wherein the electronic computer device is hooked into the fixation pins via the hang-in elements such that the electronic computer device is arranged on the back side of the electronic display.

I further provide the computer system including an electronic display, a display stand that supports the electronic display, the display stand having a bottom plate for placement of the stand on a selected location and having a vertical section extending from the bottom plate, an electronic computer device including a housing, wherein a mounting wall is fixed to the housing, and a mounting bracket fixedly connected to the mounting wall of the electronic computer device such that an overlapping part of the mounting bracket overlaps the housing of the electronic computer device at one side, wherein the mounting bracket is fixedly connected to a back side of the vertical section of the display stand such that the overlapping part of the mounting bracket contacts the bottom plate for support of the electronic computer device, and wherein the electronic computer device is a thin client device.

DETAILED DESCRIPTION

Figure 1:
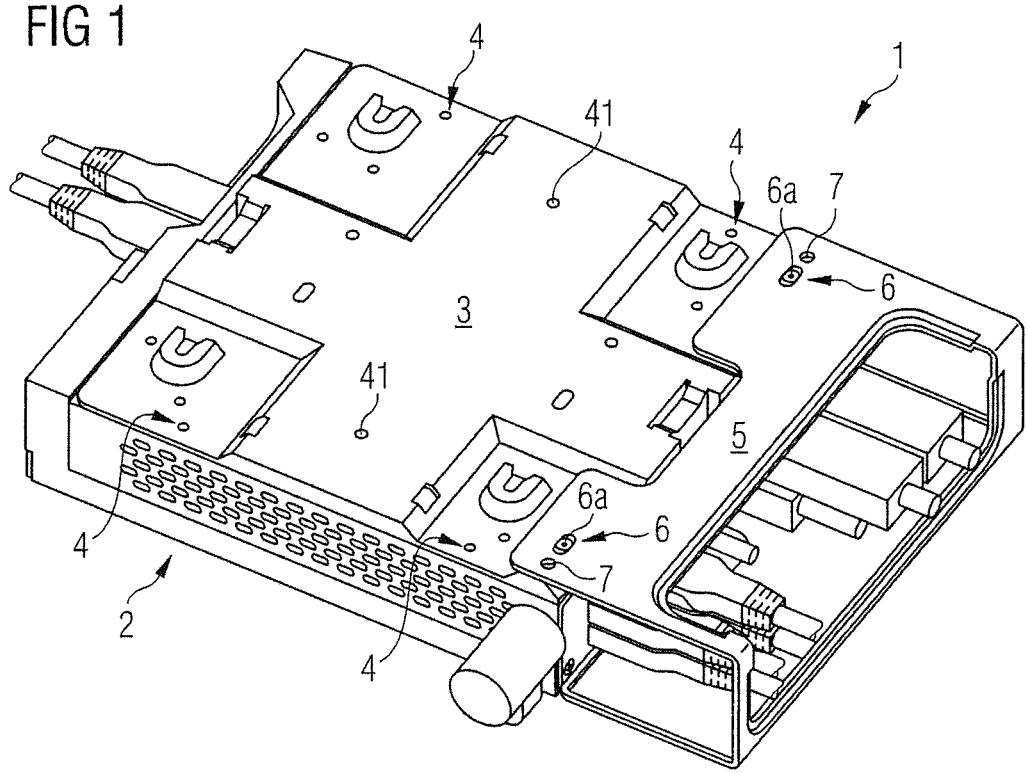
FIGS. 1 to 3 show perspective views of an electronic computer device in three mounting states according to a first example.

We provide a computer system comprising an electronic display and a display stand to support the electronic display. The display stand has a bottom plate for placement of the stand on the ground and has a vertical section extending from the bottom plate. The computer system comprises an electronic computer device with a housing, wherein a mounting wall is fixed to the housing. The computer system comprises a mounting bracket fixedly connected to the mounting wall of the electronic computer device such that an overlapping part of the mounting bracket overlaps the housing of the electronic computer device at one side. The mounting bracket fixedly connects to a back side of the vertical section of the display stand such that the overlapping part of the mounting bracket contacts the bottom plate for support of the electronic computer device.

The system allows an easy and reliable installation of a electronic computer device on the back side of the display stand and thus on the back side of the electronic display. Thus, not only the above-mentioned problems are solved, but also a very stable and safe arrangement is guaranteed. In particular, in the mounted state, a weight force of the electronic computer device is not only supported by the vertical section, but also by the bottom plate of the stand. Thus, the weight force is at least partially transferred to the ground via the bottom plate and a better force dissipation is achieved. As a result, moment forces are reduced or avoided.

The term vertical section is not limited to a section that extends exclusively in a normal direction to the bottom plate. Rather, the term comprises a section arising from the bottom plate to support a display.

The mounting wall is a separate element fixed to the housing or alternatively a part of the housing of the electronic computer device. The mounting wall, for example, is a mounting adapter or a mounting plate. In an example, the mounting wall is a master plate. The mounting wall is stable enough to support the weight of the electronic computer device. The mounting wall is fixed to the housing, e.g., by bonding, gluing or screws.

The mounting bracket is fixed to the mounting wall by screws, for example. In this regard, the mounting wall comprises one or more fixation means, e.g., threaded holes or the like. Any other means or connection techniques are possible, e.g., gluing or bonding.

The mounting bracket is fixed to the display stand by a screw, i.e., a thumb screw. In particular, a direct fixation of the single-pieced mounting bracket is provided. Due to the thumb screw, an easy installation without the tools is possible.

A free end of the overlapping part of the mounting bracket may comprise a support lug arranged on the bottom plate of the display stand. The lug is formed as a flange or a support plate, for example. Thus, the above-mentioned advantages with regard to the dissipation of forces are further improved. Due to the lug, a stable support of the mounting bracket has a wide-area contact with the bottom plate. In other words, the lug has a form-fit contact with the bottom plate in an area of the bottom plate of the stand.

The overlapping part may comprise at least one elastic element arranged between the vertical section and the mounting bracket and/or between the bottom plate and the mounting bracket. For example, several elastic elements such as rubber feet are provided, e.g., on the above-mentioned lug and on the overlapping part facing the vertical section of the stand. Thus, tolerances between the mounting bracket and the stand can be compensated for. Further, a damping function is achieved, for example, to damp vibrations of the electronic computer device, e.g., arising from a mechanical hard drive.

The mounting wall may comprise fixation means such that the mounting bracket can be fixed to the mounting wall, wherein the mounting wall is designed to be fixed to the housing in at least two different orientations. As mentioned above, the fixation means are threaded holes or the like. Further, the fixation means can comprise one or more structural features such as indentations and protrusions that engage corresponding features of the mounting bracket to establish a form-fit connection. With the mounting wall designed to be fixed in at least two different orientations, the electronic computer device can be arranged in at least two orientations on the display stand, e.g., offset by 90°. In an example, four positions are possible, each offset by 90°. Thus, a user can flexibly arrange the electronic computer device in different positions without the requirement of further or other installation components and tools. Typically, an electronic computer device has at least one connection area, to which several peripheral devices as well as the display are connected. For example, depending on an environment, the user can adapt the cabling to the electronic computer device and control the orientation of the connection area.

The vertical section of the display stand may have a pass-through opening to guide a cable and the overlapping part of the mounting bracket may have a further pass-through opening to guide a cable, wherein the further pass-through opening is arranged flush to the pass-through opening of the vertical section. Thus, the mounting bracket still allows guiding of the display cabling through the opening in the stand.

A thumb screw may be inserted through the pass-through openings from a front side of the display stand and directly engage the mounting bracket such that the mounting bracket is clamped against the vertical section of the display stand for fixation. The mounting bracket is fixed to the stand by a pressing force. Thus, an easy and reliable installation is possible. Since the thumb screw is guided through the pass-through openings, the installation is independent from the shape and design of the openings. Depending on the thickness of the vertical section, the thumb screw can be extended by an additional screw part with an inner thread at one end and an outer thread at the other end of the screw part. For better fixation, a washer is provided on the front side of the vertical section.

My computer system may comprise an electronic display with a back side, wherein fixation pins are fixedly arranged on the back side. Further, the system comprises a display stand to support the electronic display. The system comprises an electronic computer device with a housing, wherein a mounting wall is fixed to the housing, the mounting wall having hang-in elements corresponding to the fixation pins. The electronic computer device is hooked into the fixation pins via the hang-in elements such that the electronic computer device is arranged on the back side of the electronic display.

The electronic computer device may be hooked onto the backside of the display. Thus, the electronic computer device is hidden for a user sitting in front of the display.

The fixation pins are thumb screws, for example. Thus, an easy installation without further tools is possible.

The fixation pins and the corresponding hang-in elements are arranged according to the VESA standard, e.g., 100 mm×100 mm.

The hang-in-elements may be sheet-metal plates, the sheet-metal plates each comprising an elongated hole to accommodate the fixation pins. Thus, the hanging-in can easily be achieved.

My system may comprise an electronic computer device comprising a housing, wherein a mounting wall is fixed to the housing. The system comprises a mounting bracket fixedly connected to the mounting wall of the electronic computer device such that an overlapping part of the mounting bracket overlaps the housing of the electronic computer device at one side. The overlapping part of the mounting bracket comprises at least one mounting hole so that the electronic computer device can be fixedly connected to a stable element, in particular a desk or a table.

My electronic computer device can be fixed to a stable element, e.g., onto an underside of a desk. Thus, the electronic computer device may be essentially hidden for a user sitting in front of the display. Furthermore, the system allows a very high flexibility with regard to the placement of the electronic computer device.

Instead of one mounting bracket, two mounting brackets are used in an example. For example, the brackets are fixedly arranged on opposing lateral sides on the housing of the electronic computer device.

In all described systems, the electronic computer device may be a thin client device. A thin client typically is a small and lightweight computer built to connect to a server from a remote location. The server does most of the work, which can include crunching numbers and storing information for the thin client. In contrast, a conventional desktop PC (fat client) does most of the work, but can communicate with and run programs on a server.

Further details and advantages of my systems and methods will be described below with respect to examples with reference to the drawings.

FIGS. 1 to 8 refer to computer system of a first example.

Figure 2:
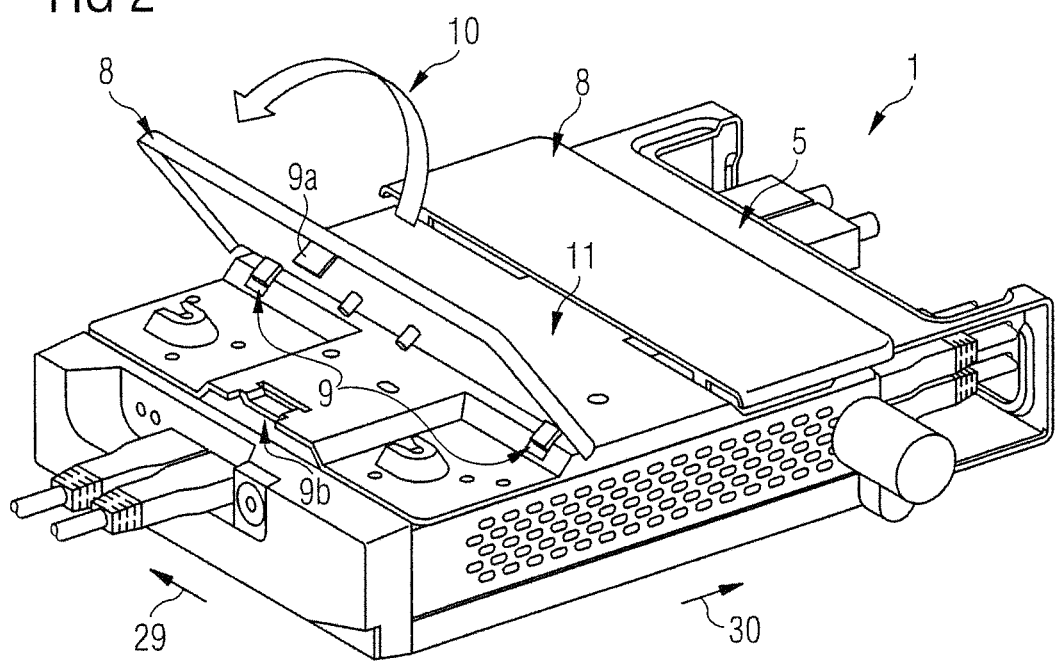
Figure 3:
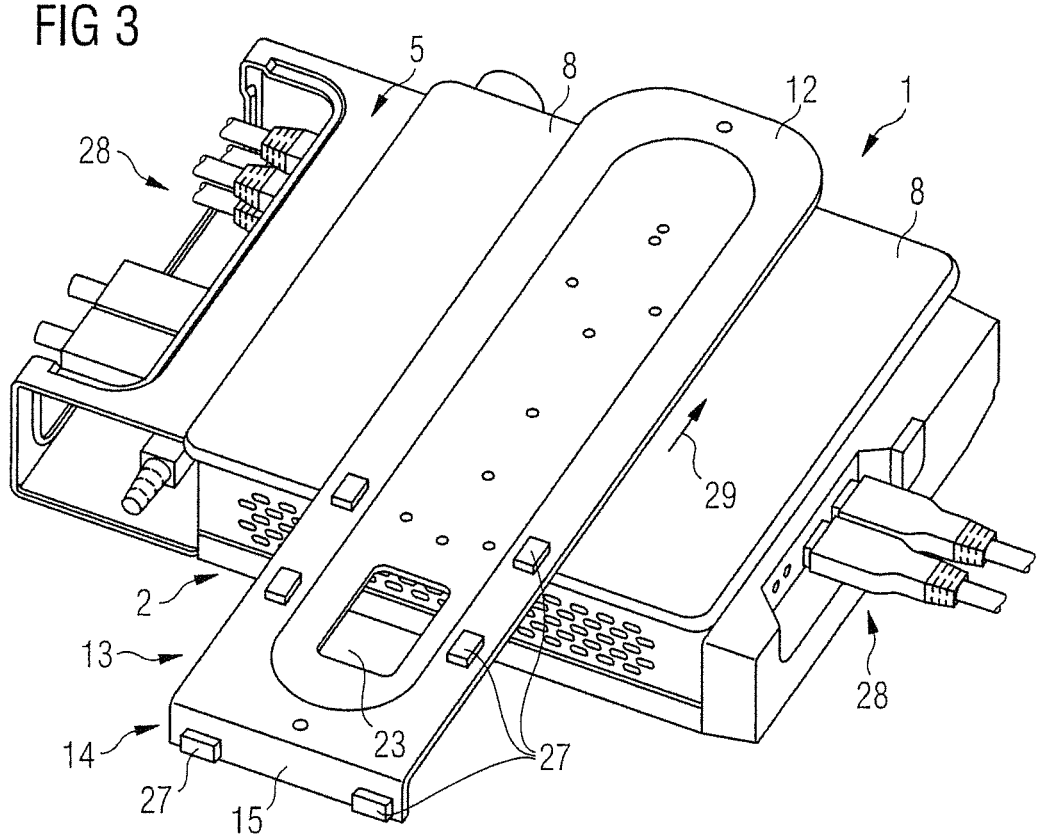

FIGS. 1 to 3 show perspective views of an electronic computer device 1, a thin client, in three mounting states. The electronic computer device 1 has a housing 2 that covers electronic components like a processor. Onto the housing 2, a mounting wall 3, which is a mounting plate, is fixed. Via four bore holes 4 the mounting wall 3 is screwed to the housing 2 (screws not shown). Less or more screws or bore holes 4, respectively, or connection techniques are possible. Alternatively, a wall of the housing 2 itself is the mounting wall.

An optional cable cover 5 is mounted to the housing 2. The cable cover 5 has positioning holes 6 and further bore holes 7. The mounting wall 3 has corresponding bore holes (not shown in FIG. 1) and positioning bosses 6a to engage in the positioning holes 6. Thus, the cable cover 5 can be easily aligned and mounted with respect to the mounting wall 3.

As shown in FIG. 2, optional side covers 8 are fixed to the mounting wall 3 at two sides such that a mounting area 11 of the mounting wall 3 remains between the covers. In this regard, each cover 8 is hooked into openings, e.g., rectangular openings, of the mounting wall 3 with two hooks or snaps 9 to build a hinge. Then, each cover 8 is rotated and pushed down as indicated via arrow 10 for the left cover 8 so that the covers 8 are fixedly arranged on the mounting wall 3. In this regard, a further hook or snap 9a snaps behind a bridge-formed engagement element 9b of the mounting wall 3.

Further, as shown in FIG. 3, a mounting bracket 12 is fixedly mounted to the mounting wall 3 in the mounting area 11 via screws (not shown). The mounting area 11 is essentially arranged in the center of the mounting wall 3. At one side, an overlapping part 13 overlaps the housing 2. The overlapping part 13 has a free end 14 having a right-angled support lug 15.

The electronic computer device 1 can be easily mounted to a display or display stand, as will be described in the following.

FIGS. 4 to 7B show the computer system 17 with an electronic display 16, e.g., a LCD display, and the electronic computer device 1. The computer system 17 has a display stand 18 with a bottom plate 19 and a vertical section 20, the latter extending from the bottom plate 19. The bottom plate 19 is designed to be placed on the ground, e.g., a table or desk. The vertical section comprises a pass-through opening 21 for cables to be guided.

The electronic computer device 1 is mounted to the display stand 18 via the mounting bracket 12 and a thumb screw 22, which is inserted into the pass-through opening 21 and directly engages the mounting bracket 12 which, for example, has a threaded hole to accommodate the screw 22. An optional washer 24 is provided. The screw 22 is inserted from a front side 25 of the display stand 18, wherein the electronic computer device 1 is mounted to the back side 26 of the display stand 18 or the vertical section respectively. Due to the direct engagement of the screw 22 with the mounting bracket 12, the mounting is independent from a size and shape of the pass-through opening 21 of the display stand 18.

Figure 6:
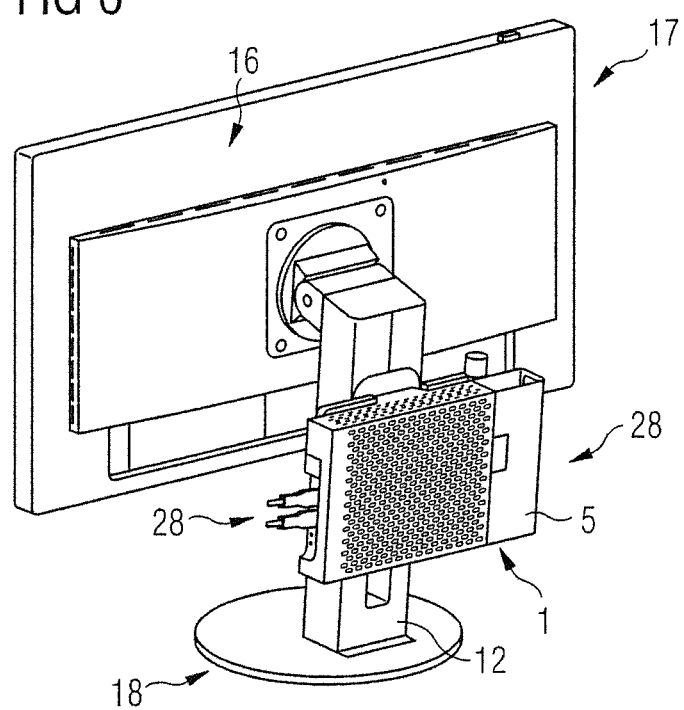

As can be seen in FIG. 6, for example, the support lug 15 contacts the bottom plate 19 of the stand 18. In other words the lug 15 lies on a surface of the bottom plate 19. Thus, the mounting bracket 12 is supported on the bottom plate 19, which has the above-mentioned advantages.

Figure 4:
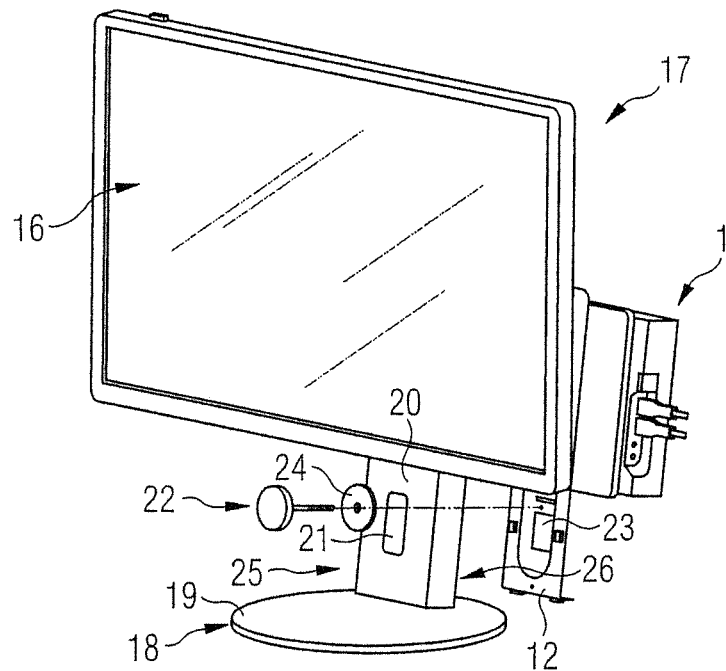
FIGS. 4 to 7B show perspective views of a computer system according to the first example with an electronic display and with an electronic computer device as shown in FIGS. 1 to 3.

As can be seen in FIGS. 3 and 4, for example, the overlapping part 13 of the mounting bracket 12 has several elastic elements 27, e.g., rubber feet arranged between the vertical section 20 and the mounting bracket 12 and between the bottom plate 19 and the mounting bracket 12.

As can be seen in FIGS. 3 and 4, for example, the mounting bracket 12 has a further pass-through opening 23 arranged flush to the pass-through opening 21 of the vertical section 20. Thus, cables from the display 16 to the electronic computer device 1 can be routed through both openings 21 and 23.

Figure 5:
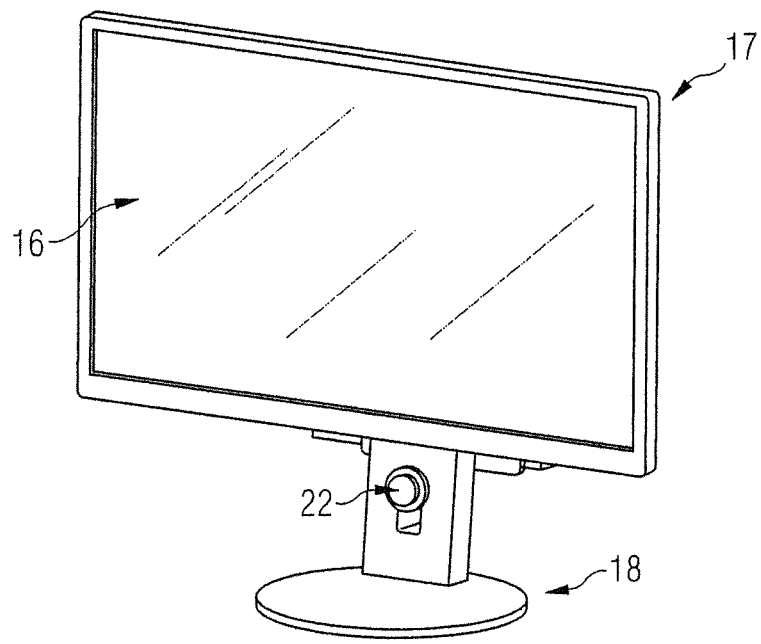

FIGS. 5 and 6 show the computer system 17 from a front side and a back side.

As can be seen in FIG. 6, the electronic computer device 1 is fixed to the stand 18 in a first orientation such that the cables of opposing connection areas 28 (see also FIG. 3) of the electronic computer device 1 extend from the housing 2 to the left and/or right. This is due to the fact that the mounting wall 3 has fixation means 41 (see FIG. 1) for the mounting bracket 12 that enable the mounting bracket 12 to be fixed to the computer device 1 in a first main direction 29 (see FIG. 2).

Figure 7A:
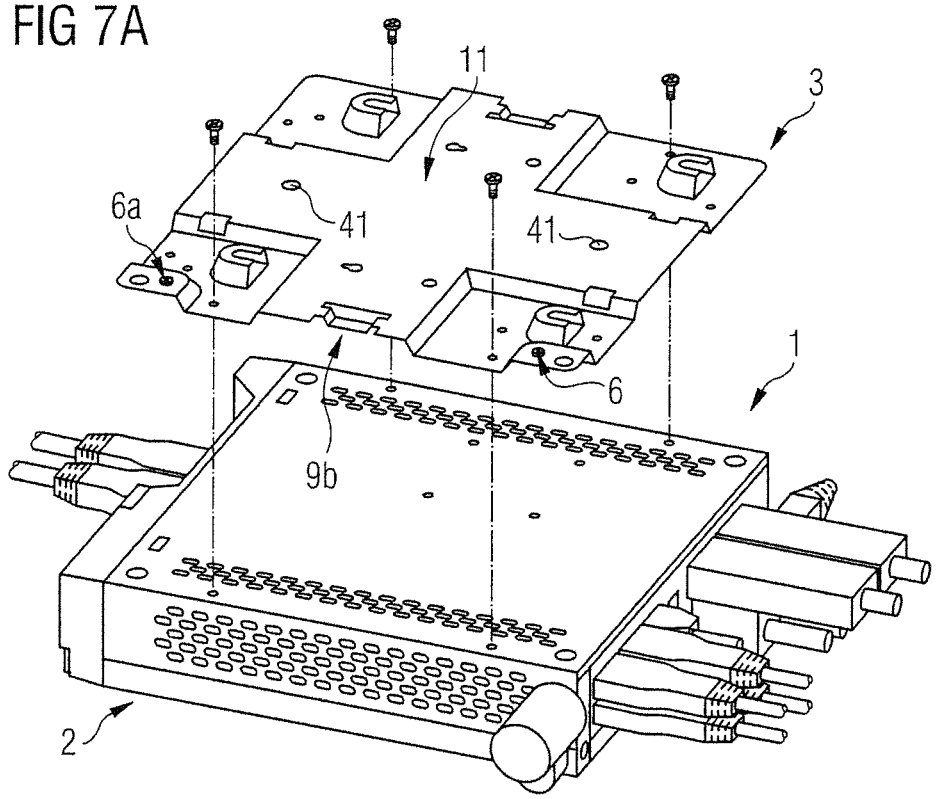
Figure 7B:
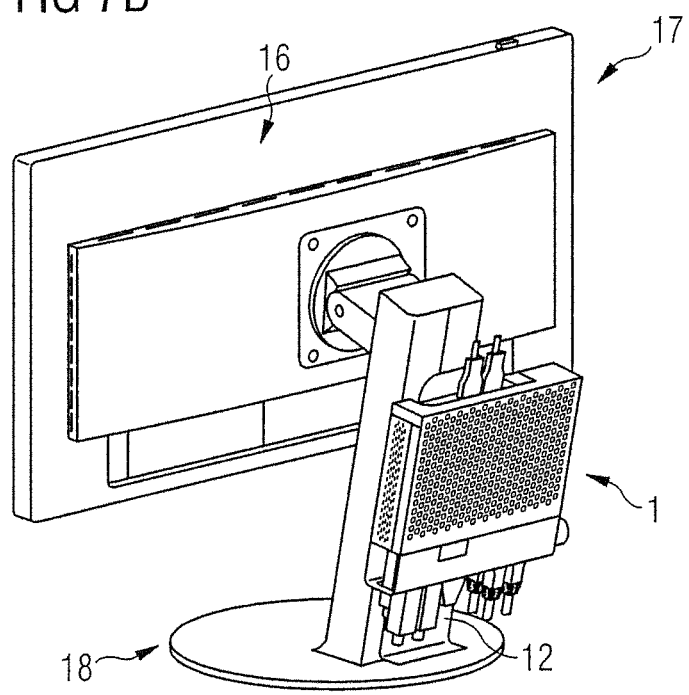

However, the mounting wall 3 also allows a fixation of the mounting bracket 12 to the computer device 1 in a second direction 30 (see FIG. 2). The mounting wall 3 only needs to be dismounted, rotated around 90° and fixed to the housing 2 again. This is shown in FIGS. 7A and 7B. Thus, the electronic computer device 1 can be mounted to the display stand 18 in a second orientation, 90° rotated with regard to the first orientation.

Furthermore, the electronic computer device 1 can also be mounted in two further orientations, 180° turned compared to the installations as shown in FIGS. 6 and 7A, 7B. As can be seen from FIGS. 6 and 7B, in the horizontally mounted orientation according to FIG. 6, the cable cover 5 provides security and a neat appearance, whereas in the vertically mounted orientation according to FIG. 7B, no cable cover 5 is needed.

Figure 8:
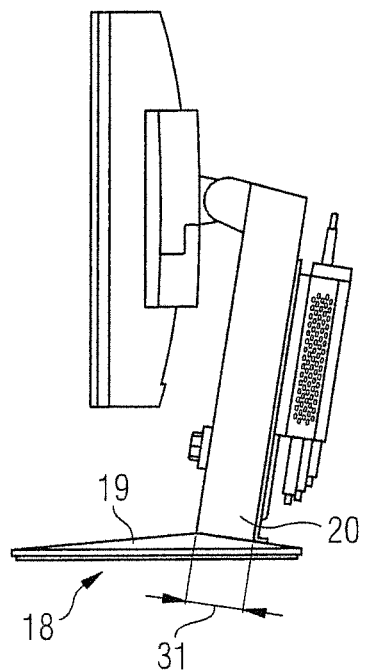
FIG. 8 shows a side view of the computer system of FIGS. 4 to 7B according to the first example.
Figure 9:
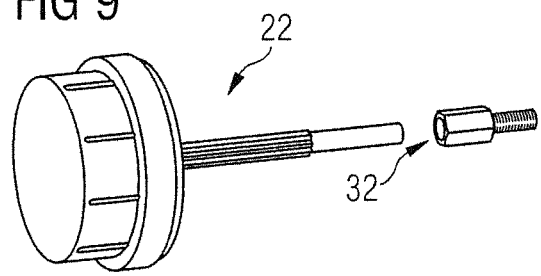
FIG. 9 shows a perspective view of a thumb screw for mounting of the electronic computer device to the display according to the first example.

FIG. 8 shows a side view of the system 17 according to FIG. 7B. Depending on a thickness 31 of the vertical section 20 of the stand 18, in particular in the area of the pass-through opening 21, the screw 22 can be extended via an additional screw part 32 as shown in FIG. 9.

FIGS. 10 to 13 refer to a computer system 17 according to a second example. If applicable, the aforementioned details apply analogously and the same reference signs are used.

Figure 10:
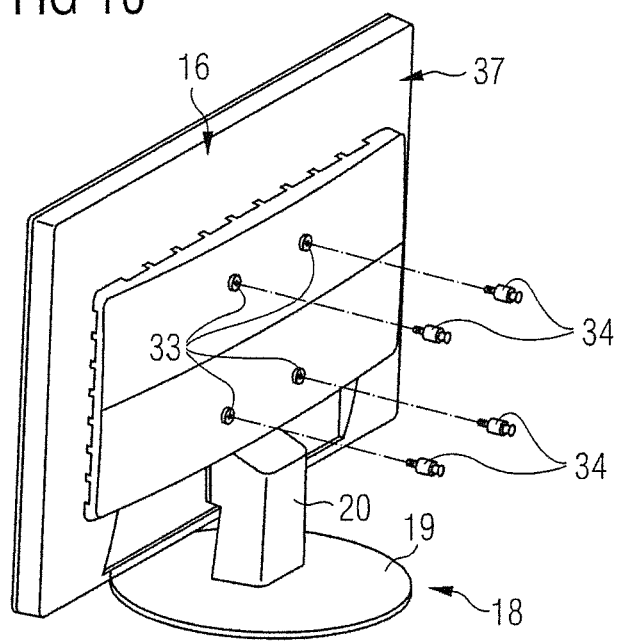
FIGS. 10 and 11 show perspective views of an electronic display according to a second example.
Figure 11:
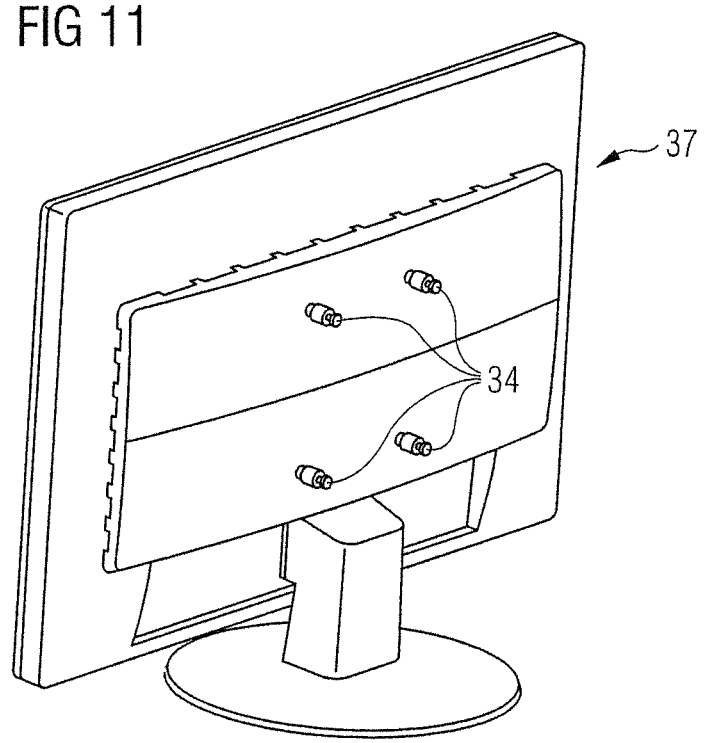
Figure 12:
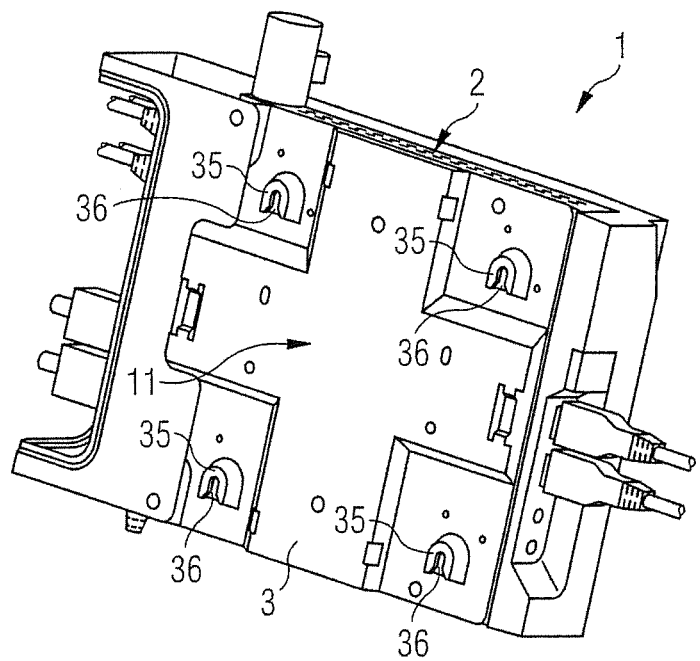
FIG. 12 shows a perspective view of an electronic computer device according to the second example.
Figure 13:
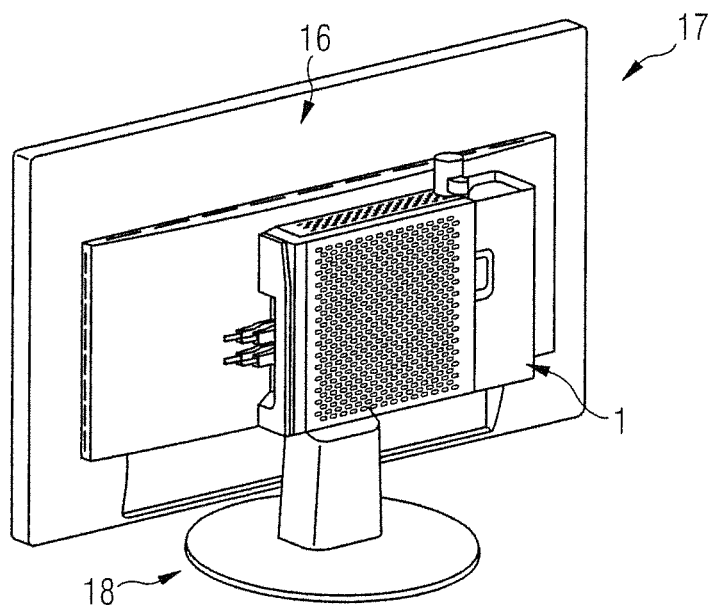
FIG. 13 shows a perspective view of a computer system according to a third example.

The electronic display 16 comprises four fixation means 33, i.e., threaded holes into which fixation pins 34, i.e., thumb screws, are screwed (see FIGS. 10 and 11). As can be seen in FIG. 12, an electronic computer device 1 that is essentially the same as described with respect to FIGS. 1 to 7B, has a mounting wall 3 with a connection area 11. The mounting wall 3 has hang-in elements 35 that are sheet-metal plates or latches with elongated holes 36.

The fixation means 33 or the fixation pins 34, respectively, and the hang-in elements 35 correspond to each other and are arranged according to the VESA standard by 100 mm×100 mm.

Via the hang-in elements 35, the electronic computer device 1 can easily be hooked into the fixation pins 34 on the back side 37 of the display 16. The electronic computer device 1 is thus arranged on the electronic display 16.

Figure 14:
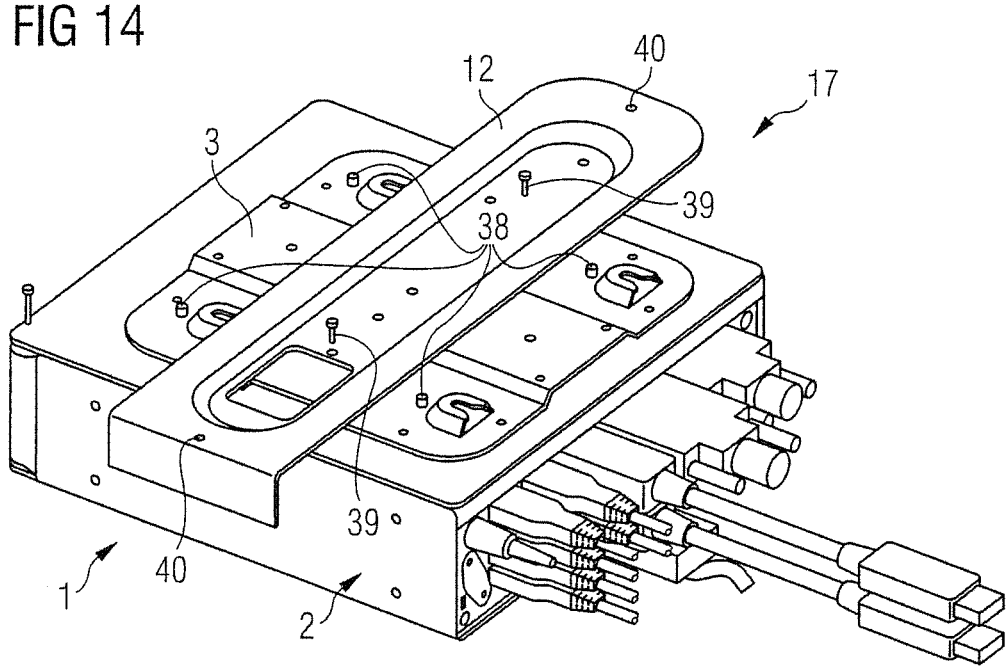
FIGS. 14 and 15 show perspective views of computer systems according to further examples.

FIG. 14 shows a further example. The computer system 17 (display not shown) essentially comprises an electronic computer device 1 as described before. The electronic computer device 1 has a mounting wall 3 fixed via four screws 38 to the housing 2 of the electronic computer device 1. Further, a mounting bracket 12, for example, the same as described above, is fixed to the mounting wall 3 via two screws 39. The mounting bracket 12 comprises fixation means 40, e.g., bore or threaded holes such that the electronic computer device 1 can be fixed to a table or desk, e.g., onto an underside of the table/desk.

Figure 15:
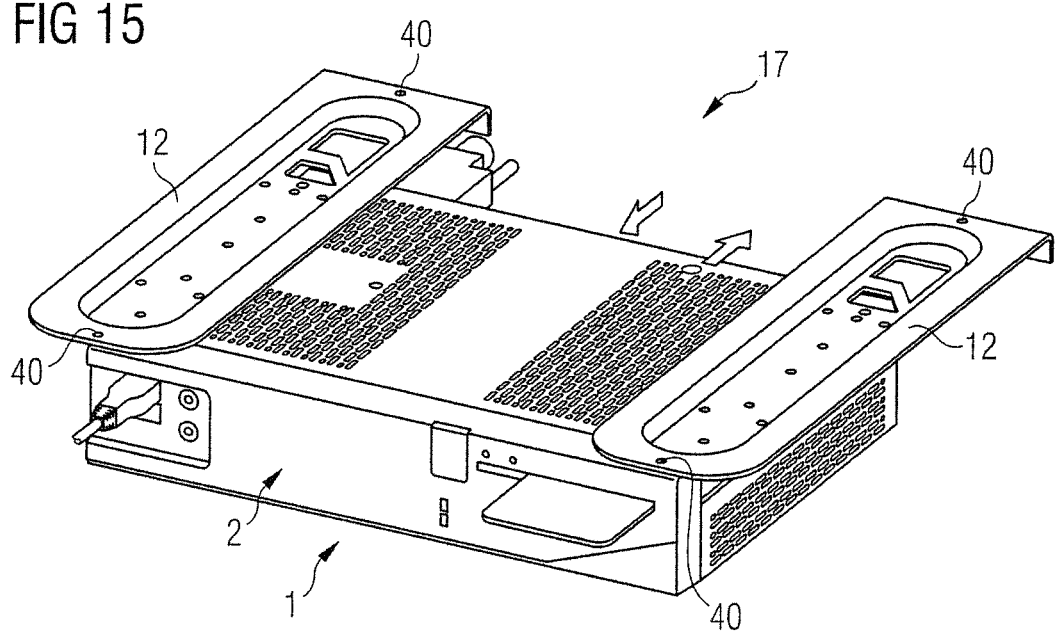

FIG. 15 shows a further example that is essentially similar to the example according to FIG. 14. As a difference, the electronic computer device 1 lacks a mounting wall 3, but has two mounting brackets 12 instead, which are directly mounted to the housing 2 of computer device 1, e.g., by screws. In particular, the mounting brackets 12 are arranged on opposing lateral sides of one housing side. Similarly, the electronic computer device 1 can be mounted to a stable element, e.g., a table or a desk, by the mounting brackets 12.

The invention claimed is:

1. A computer system comprising:
an electronic display;
a display stand that supports the electronic display, the display stand having a bottom plate for placement of the stand on a selected location and having a vertical section extending from the bottom plate;
an electronic computer device comprising a housing, wherein a mounting wall is fixed to the housing; and
a mounting bracket fixedly connected to the mounting wall of the electronic computer device such that an overlapping part of the mounting bracket overlaps the housing of the electronic computer device at one side,
wherein the mounting bracket is fixedly connected to a back side of the vertical section of the display stand such that the overlapping part of the mounting bracket contacts the bottom plate for support of the electronic computer device.

2. The computer system according to claim 1, wherein a free end of the overlapping part of the mounting bracket comprises a support lug arranged on the bottom plate of the display stand.

3. The computer system according to claim 1, wherein the overlapping part comprises at least one elastic element arranged between the vertical section and the mounting bracket and/or between the bottom plate and the mounting bracket.

4. The computer system according to claim 1, wherein the mounting wall comprises fixation means such that the mounting bracket can be fixed to the mounting wall, and the mounting wall is fixable to the housing in at least two different orientations.

5. The computer system according to claim 1, wherein the vertical section of the display stand has a pass-through opening to guide a cable and the overlapping part of the mounting bracket has a further pass-through opening to guide a cable, and the further pass-through opening is arranged flush to the pass-through opening of the vertical section.

6. The computer system according to claim 5, wherein a thumb screw is inserted through the pass-through openings from a front side of the display stand and directly engages the mounting bracket such that the mounting bracket is clamped against the vertical section of the display stand for fixation.

7. The computer system according to claim 1, wherein the electronic computer device is a thin client device.

8. A computer system comprising:
an electronic display with a back side, wherein fixation pins are fixedly arranged on the back side;
a display stand to support the electronic display; and
an electronic computer device comprising a housing, wherein a mounting wall is fixed to the housing, the mounting wall having hang-in elements corresponding to the fixation pins,
wherein the electronic computer device is hooked into the fixation pins via the hang-in elements such that the electronic computer device is arranged on the back side of the electronic display.

9. The computer system according to claim 8, wherein the hang-in-elements are sheet-metal plates or latches, the sheet-metal plates each comprising an elongated hole to accommodate the fixation pins.

* * * * *